US010950699B2

(12) United States Patent
Hu et al.

(10) Patent No.: US 10,950,699 B2
(45) Date of Patent: Mar. 16, 2021

(54) TERMINATION FOR VERTICAL TRENCH SHIELDED DEVICES

(71) Applicant: Siliconix Incorporated, San Jose, CA (US)

(72) Inventors: Jun Hu, San Bruno, CA (US); M. Ayman Shibib, San Jose, CA (US); Misbah Azam, San Jose, CA (US); Kyle Terrill, San Jose, CA (US)

(73) Assignee: Vishay-Siliconix, LLC, San Jose, CA (US)

( * ) Notice: Subject to any disclaimer, the term of this patent is extended or adjusted under 35 U.S.C. 154(b) by 0 days.

(21) Appl. No.: 16/532,001

(22) Filed: Aug. 5, 2019

(65) Prior Publication Data

US 2021/0043741 A1    Feb. 11, 2021

(51) Int. Cl.
| | | |
|---|---|---|
| *H01L 29/40* | (2006.01) | |
| *H01L 29/78* | (2006.01) | |
| *H01L 29/66* | (2006.01) | |
| *H01L 29/423* | (2006.01) | |
| *H01L 29/06* | (2006.01) | |
| H01L 29/739 | (2006.01) | |

(52) U.S. Cl.
CPC ........ *H01L 29/407* (2013.01); *H01L 29/0696* (2013.01); *H01L 29/401* (2013.01); *H01L 29/404* (2013.01); *H01L 29/4238* (2013.01); *H01L 29/66734* (2013.01); *H01L 29/7811* (2013.01); *H01L 29/7813* (2013.01); *H01L 29/7397* (2013.01)

(58) Field of Classification Search
CPC ............. H01L 29/7813; H01L 29/7827; H01L 29/0878; H01L 29/404; H01L 29/407; H01L 29/1041; H01L 29/4236; H01L 29/0623; H01L 29/0696
See application file for complete search history.

(56) References Cited

U.S. PATENT DOCUMENTS

| | | | |
|---|---|---|---|
| 8,829,607 B1 * | 9/2014 | Hsieh ................. | H01L 29/7811 257/330 |
| 10,103,257 B1 * | 10/2018 | Qin ..................... | H01L 29/0696 |
| 2003/0089946 A1 | 5/2003 | Hshieh et al. | |
| 2006/0170036 A1 | 8/2006 | Yilmaz | |
| 2010/0019316 A1 | 1/2010 | Pattanayak et al. | |

(Continued)

FOREIGN PATENT DOCUMENTS

KR    1020040053318    6/2004

*Primary Examiner* — Dung A. Le

(57) ABSTRACT

A vertical trench shield device can include a plurality of gate structures and a termination structure surrounding the plurality of gate structures. The plurality of gate structures can include a plurality of gate regions and a corresponding plurality of gate shield regions. The plurality of gate structures can be disposed between the plurality of source regions, and extending through the plurality of body regions to the drift region. The plurality of gate structures can be separated from each other by a first predetermined spacing in a core area. A first set of the plurality of gate structures can extend fully to the termination structure. The ends of a second set of the plurality of gate structures can be separated from the termination structure by a second predetermined spacing. The first and second spacings can be configured to balance charge in the core area and the termination area in a reverse bias condition.

22 Claims, 16 Drawing Sheets

(56) References Cited

U.S. PATENT DOCUMENTS

| | | | |
|---|---|---|---|
| 2012/0112268 A1 | 5/2012 | Tai et al. | |
| 2012/0292696 A1* | 11/2012 | Park | H01L 29/7813 |
| | | | 257/334 |
| 2013/0292761 A1 | 11/2013 | Yeh et al. | |
| 2016/0315053 A1* | 10/2016 | Pan | H01L 29/7811 |
| 2017/0194486 A1* | 7/2017 | Venkatraman | H01L 29/66734 |
| 2020/0212219 A1* | 7/2020 | Kim | H01L 29/407 |
| 2020/0227526 A1* | 7/2020 | Li | H01L 21/02236 |

* cited by examiner

TERMINATION FOR VERTICAL TRENCH SHIELDED DEVICES

BACKGROUND OF THE INVENTION

Referring to FIGS. 1A and 1B, perspective views of exemplary Metal-Oxide-Semiconductor Field Effect Transistors (MOSFETs) according to the conventional art are shown. As illustrate the perspective view shows a corner portion of the MOSFET 100. The MOSFET 100 can include one or more source regions 105, one or more gate regions 110, one or more gate insulator regions 115, one or more gate shield regions 120, one or more gate shield insulator regions 125, one or more body regions 130, one or more drift regions 135, one or more drain regions 140, one or more drain contacts 145, one or more termination regions 150 and one or more termination insulator regions 155. Other regions not illustrated can include one or more trace layers, one or more vias, one or more insulator layers, one or more passivation layers, one or more gate contacts, one or more termination contacts, one or more gate shield contacts, one or more source/body contacts, and the like.

In one implementation, the drift region 135 can be disposed between a drain region 140 and the body region 130. A plurality of source regions 105, a plurality of gate regions 110, a plurality of gate insulator regions 115, a plurality of gate shield regions 120, and a plurality of gate shield insulator regions 125 can be disposed within the body region 130. The gate regions 110 and gate shield regions 120 can be formed as a plurality of parallel elongated structures (e.g., stripped cell structure). The gate insulator region 115 can surround the gate regions 110, and the gate shield insulator region 125 can surround the gate shield regions 120. Thus, the gate regions 110 and gate shield regions 120 are electrically isolated from the surrounding source regions 105, body region 130 and drift region 135 by the gate insulator regions 115 and gate shield insulator regions 125. The plurality of gate regions 110 can be electrically coupled together by one or more gate contacts (not shown). The source regions 105 can be formed along the periphery of the gate insulator regions 115. The source regions 105 can be separated from the drift region 135 and drain region 140 by the body region 130. The source regions 105 and the body region 130 can be electrically coupled together by one or more source/body contacts (not shown). The drain contact 145 can be disposed on the drain region 140. One or more trace layers, one or more vias, one or more insulator layers, one or more passivation layers (not shown) can be disposed over the gate regions 110, the source regions 105, and the body regions 130.

Although FIGS. 1A and 1B illustrate a portion of a MOSFETs with three parallel elongated structures of source regions 105, gate regions 110, gate insulator regions 115, gate shield regions 120 and gate shield insulator regions 125, commonly referred to as cell structures, it is to be appreciated that implementations of the MOSFET typically include many more such cell structures.

In one implementation, the source regions 105 and the drain region 140 can be heavily n-doped (N+) semiconductor, such as silicon doped with phosphorous or arsenic. The drift region 135 can be lightly n-doped (N−) semiconductor, such as silicon doped with phosphorous or arsenic. The body region 130 can be p-doped (P) semiconductor, such as silicon doped with boron. The gate regions 110, gate shield regions 120 and termination region 150 can be heavily n-doped (N+) semiconductor, such as polysilicon doped with phosphorous. The gate insulator regions 115, gate shield insulator regions 125 and termination insulator region 155 can be an insulator, such as silicon dioxide.

When the potential of the gate regions 110, with respect to the source regions 105, is increased above the threshold voltage of the MOSFET 100, a conducting channel can be induced in the body region 130 along the periphery of the gate insulator regions 115. The MOSFET 100 can then conduct current between the drain region 130 and the source regions 105. Accordingly, the MOSFET 100 is in its ON-state.

When the potential of the gate regions 110 is reduced below the threshold voltage, the channel is no longer induced. As a result, a voltage potential applied between the drain region 140 and the source regions 105 will not cause current to flow there between. Accordingly, the MOSFET 100 is in its OFF-state and the junction formed by the body region 130 and the drain region 140 can support the voltage applied across the source and drain. The lightly n-doped (N−) drift region 135 results in a depletion region that extends into both the body regions 130 and the drain region 140, thereby reducing a punch through effect in its OFF-state. Accordingly, the lightly n-doped (N−) drift region 135 acts to increase the breakdown voltage of the MOSFET 100.

The channel width of the MOSFET 100 is a function of the length of the plurality of the source regions 105 along the periphery of the gate insulator regions 110. The channel length of the MOSFET 100 is a function of the width of the body region 130 between the source regions 105 and the drift region 135 along the periphery of the gate insulator regions 115. Thus, the MOSFET 100 can provide a large channel width to length ratio. The MOSFET device 100 can therefore be advantageously utilized for power MOSFET applications, such as switching elements in a pulse width modulation (PWM) voltage regulator.

The termination region 150 and termination insulator region 155 can be disposed in a periphery region surrounding the core region that includes the one or more source regions 105, one or more gate regions 110, one or more gate insulator regions 115, one or more gate shield regions 120, one or more gate shield insulator regions 125 and one or more body regions 130. The termination region 150 can be electrically coupled (not shown) to the gate shield region 120, the body regions 130 and the source regions 105. In one implementation, the one or more gate regions 110 and gate shield regions 120 extend substantially to the surrounding termination region 150, as illustrated in FIG. 1A. In another implementation, a gap, comprising a portion of the one or more body regions 130, is disposed between the ends of the one or more gate regions 110 and gate shield regions 120 and the surrounding termination region 150, as illustrated in FIG. 1B.

The concept of charge balancing can be utilized in semiconductor devices such as MOSFET 100 to improve the breakdown voltage, lower the on-resistance, increase the switching speed, and or the efficiency of the semiconductor device. A high doping concentration in the n-doped silicon drift regions 135 between two adjacent gate shield regions 120 result in a low on-resistance of the devices. Meanwhile, when a reverse voltage is applied, the charge in the n-doped drift regions 135 between adjacent gate shield regions 120 is depleted from a shield effect so that a high breakdown voltage can be achieved despite the high impurity concentration in the n-doped drift regions 135. However, it becomes more challenging to achieve charge balance with a high cell density, a termination region 150 and a deep gate shield region 120, especially at the edges or the corners of the active area proximate the termination region 150.

Referring now to FIGS. 2A and 2B partial views of an exemplary MOSFET are shown to illustrate electric fields in mesa regions 210 proximate the gate structures 220 and the termination region 230. The mesa regions 210 can include the source regions body regions and portions of the drift region, and the gate structures 220 can include the gate regions and gate shield regions of the MOSFET. In FIG. 2A, the gate structures 220 substantially abut the termination region 230, and the width of the mesa regions 210 between the gate structures 220 has a substantially uniform width of $w_m$. When a reverse bias is applied to the MOSFET as illustrated in FIG. 2A, the charge in the drift region between the termination region 230 and the gate shield regions of the gate structures 220 at the corners of the mesa regions 210 is depleted faster than the charge along the mesa regions 210 away from the corners. Accordingly, the breakdown voltage is limited at the corners by the over-shielding effect from the termination region 230 and the gate structure 220. In FIG. 2B, the gate structures 220 are separated by a portion of the mesa regions 210 from the termination region 230 by a gap of width $w_g$. Away from the ends of the gate structures 220, the mesa regions 210 of substantially uniform width $w_m$ separate the gate structures 220. When a reverse bias is applied to the MOSFET as illustrated in FIG. 2B, the charge along the mesa regions 210 away from the ends of the gate structures 220 is balanced by the opposite charge from the parallel gate structures 220. At the ends of the gate structures 220, where it is separated from the termination region 230 by gap $w_m$ of the mesa region 210, charge balance can be achieved at location x between the ends of the gate structures 220 and the termination region 230. However, at location y the charge in the mesa regions 210 is balanced by the shield effect from only one side of the termination regions 230 and the corners of the gate structures 220. Therefore, the shield effect becomes weaker and the local breakdown voltage is lower. In order to improve the breakdown voltage at location y, $w_g$ can be reduced with respect to $w_m$ to enhance the shield effect to the charge at location y in the mesa regions 210. However, as a tradeoff, the mesa region at the location x becomes over shielded due to the narrowing of the gap and the local breakdown voltage at location x becomes lower. Accordingly, both the under-shielded at location y case and the over-shielded at location x case have a lower breakdown voltage than the charge balanced scenario, as illustrated in FIG. 3. Therefore, there is a continuing need for a charge balanced termination design that can overcome the charge imbalance problem and improve the breakdown voltage in such devices.

SUMMARY OF THE INVENTION

The present technology may best be understood by referring to the following description and accompanying drawings that are used to illustrate embodiments of the present technology directed toward termination for vertical trench shielded devices and methods of manufacturing.

In one embodiment, a vertical trench device, such as a Metal-Oxide-Semiconductor Field Effect Transistor (MOSFET), can include a plurality of gate structures and one or more termination structures. The plurality of gate structures can include a plurality of gate regions and a corresponding plurality of gate shield regions. The plurality of gate structures can be separated from each other by a first predetermined spacing in a core area. The one or more termination structures can surround the plurality of gate structures. The plurality of gate structures can extend to a first termination structure in a prescribed pattern. In one prescribed pattern, a first set of the gate shield regions can extend fully to a first termination structure. A second set of the gate shield regions can be separated from the first termination structure by a second predetermined spacing. The second predetermined spacing can be between approximately one hundred and forty percent and sixty percent of the first predetermined spacing.

In another embodiment, a method of manufacturing a vertical trench device, can include forming a plurality of gate trenches and one or more termination trenches down through a body region. The one or more termination trenches can surround the plurality of gate trenches. The plurality of gate trenches can extend to a first termination trench in a prescribed pattern. Insulator regions can be formed in the plurality of gate trenches and the one or more termination trenches. A first semiconductor layer can be formed in the plurality of gate trenches and the one or more termination trenches after forming the insulator regions in the plurality of gate trenches and the one or more termination trenches. Portions of the first semiconductor layer in the plurality of gate trenches can be removed, and then an insulator region can be formed in the plurality of gate trenches where portions of the first semiconductor layer have been removed. A second semiconductor layer can be formed in the plurality of gate trenches after forming the insulator region in the gate trenches where portions of the first semiconductor layer have been removed. A plurality of source regions can be formed in the body regions between the plurality of gate trenches.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1A:
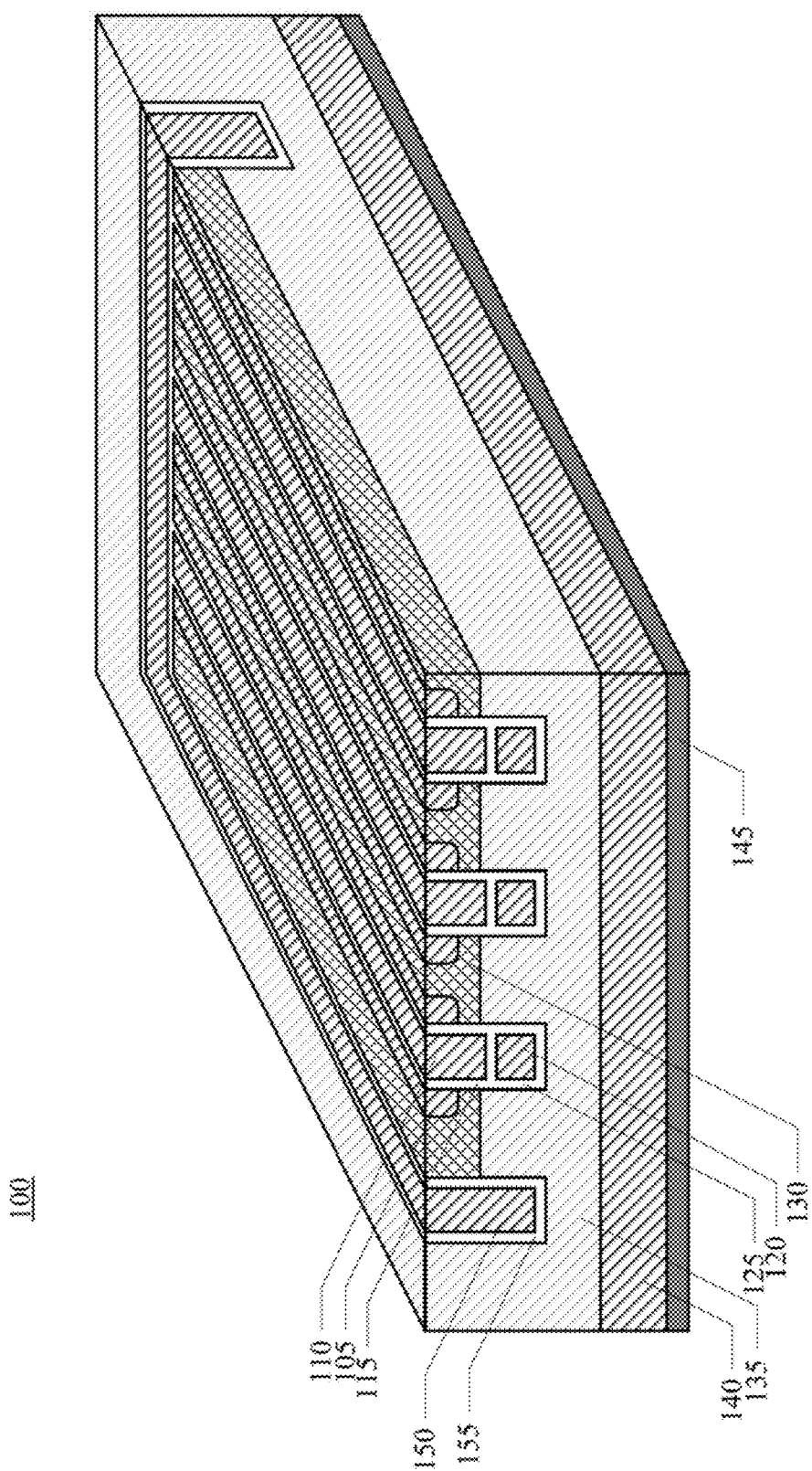
FIGS. 1A and 1B show perspective views of exemplary Metal-Oxide-Semiconductor Field Effect Transistors (MOSFETs) according to the conventional art.
Figure 1B:
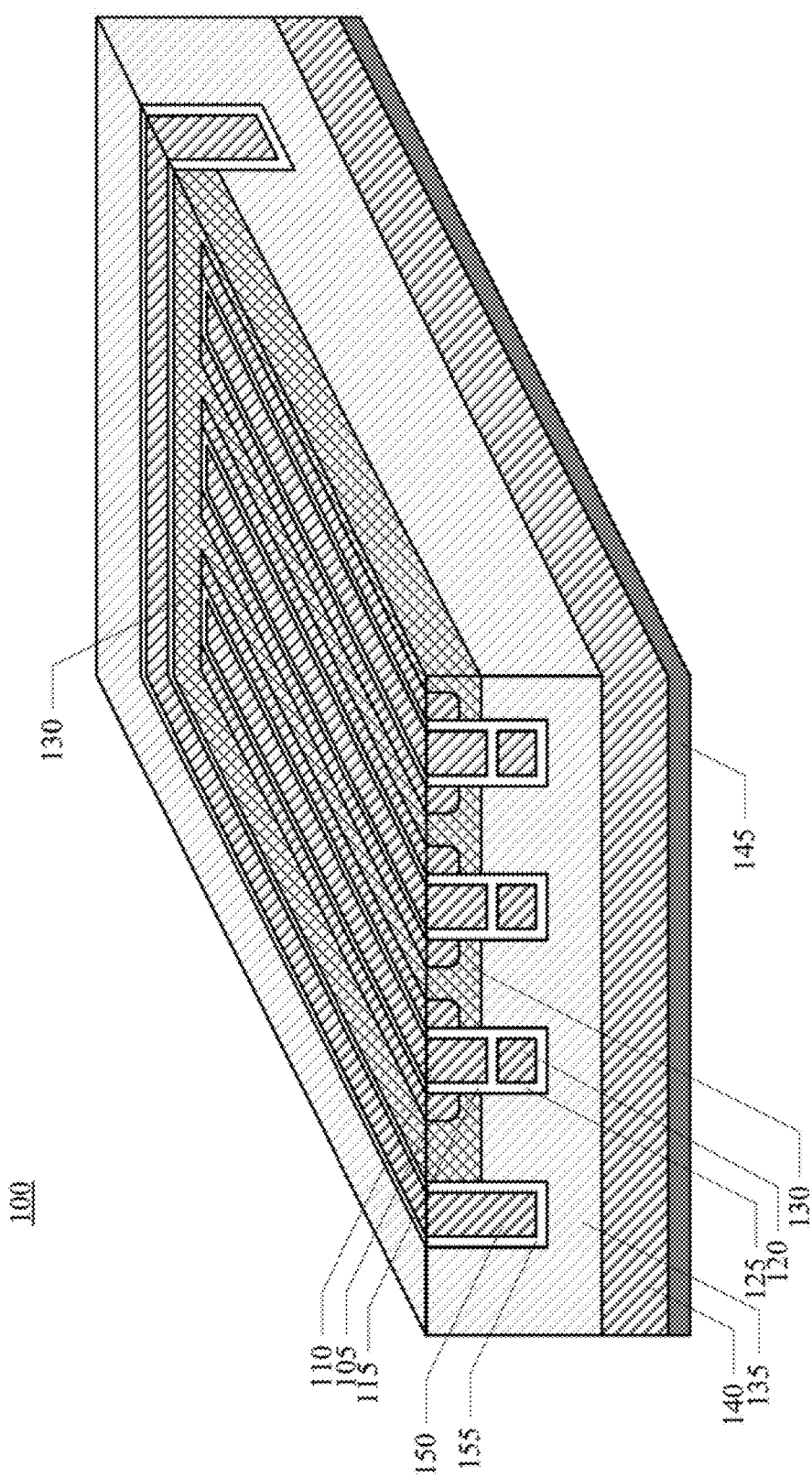
Figure 2A:
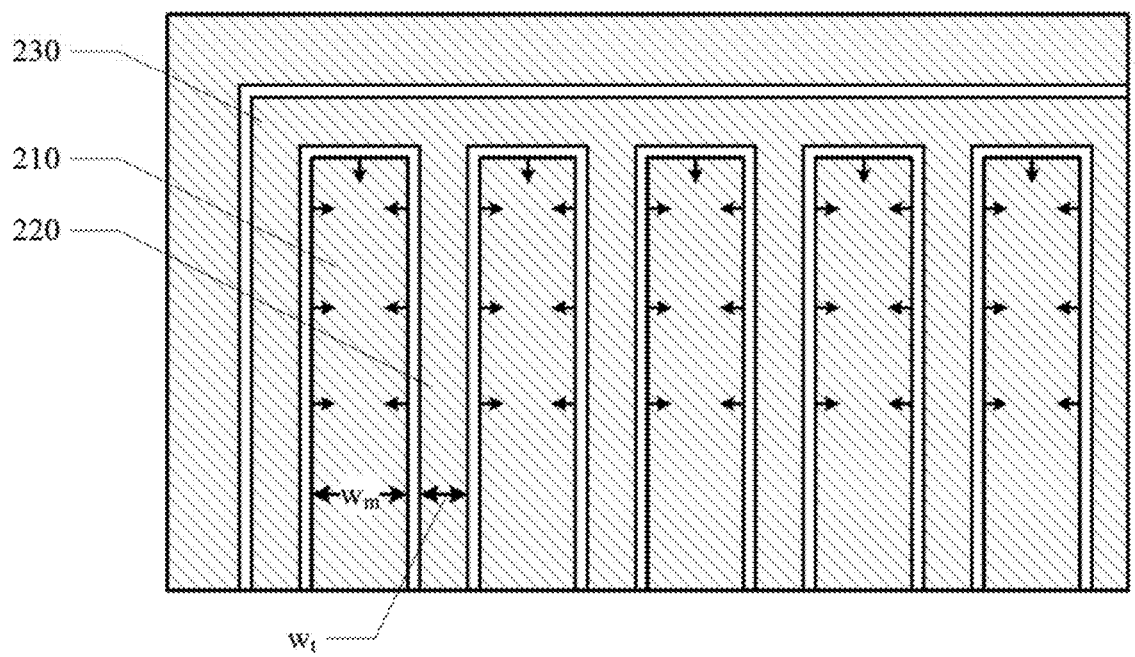
FIGS. 2A and 2B show partial views of exemplary MOSFETs according to the conventional art.
Figure 2B:
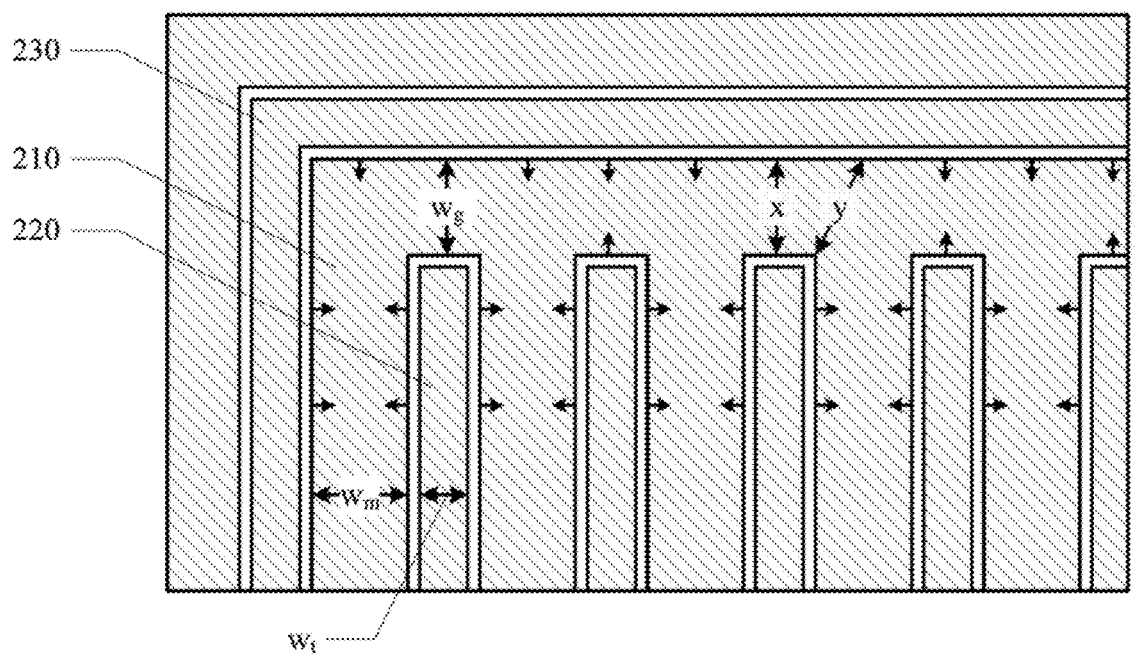
Figure 3:
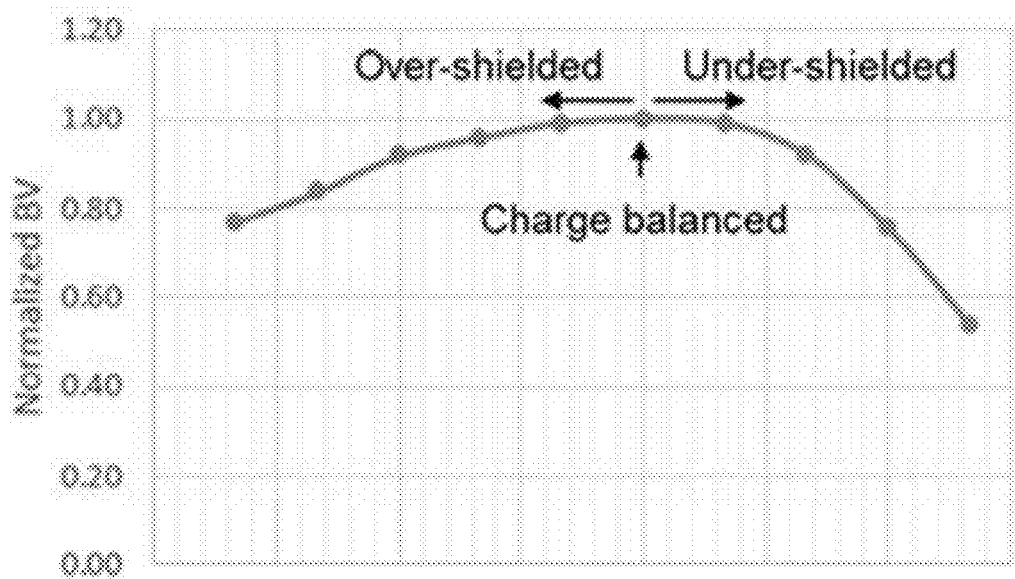
FIG. 3 shows a relationship between shielding proximate a termination region and a breakdown voltage of MOSFETs according to the conventional art.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting. As used herein, alphabetic portions of a given reference number identify different or related portions or instances of a given element or feature.

Figure 4:
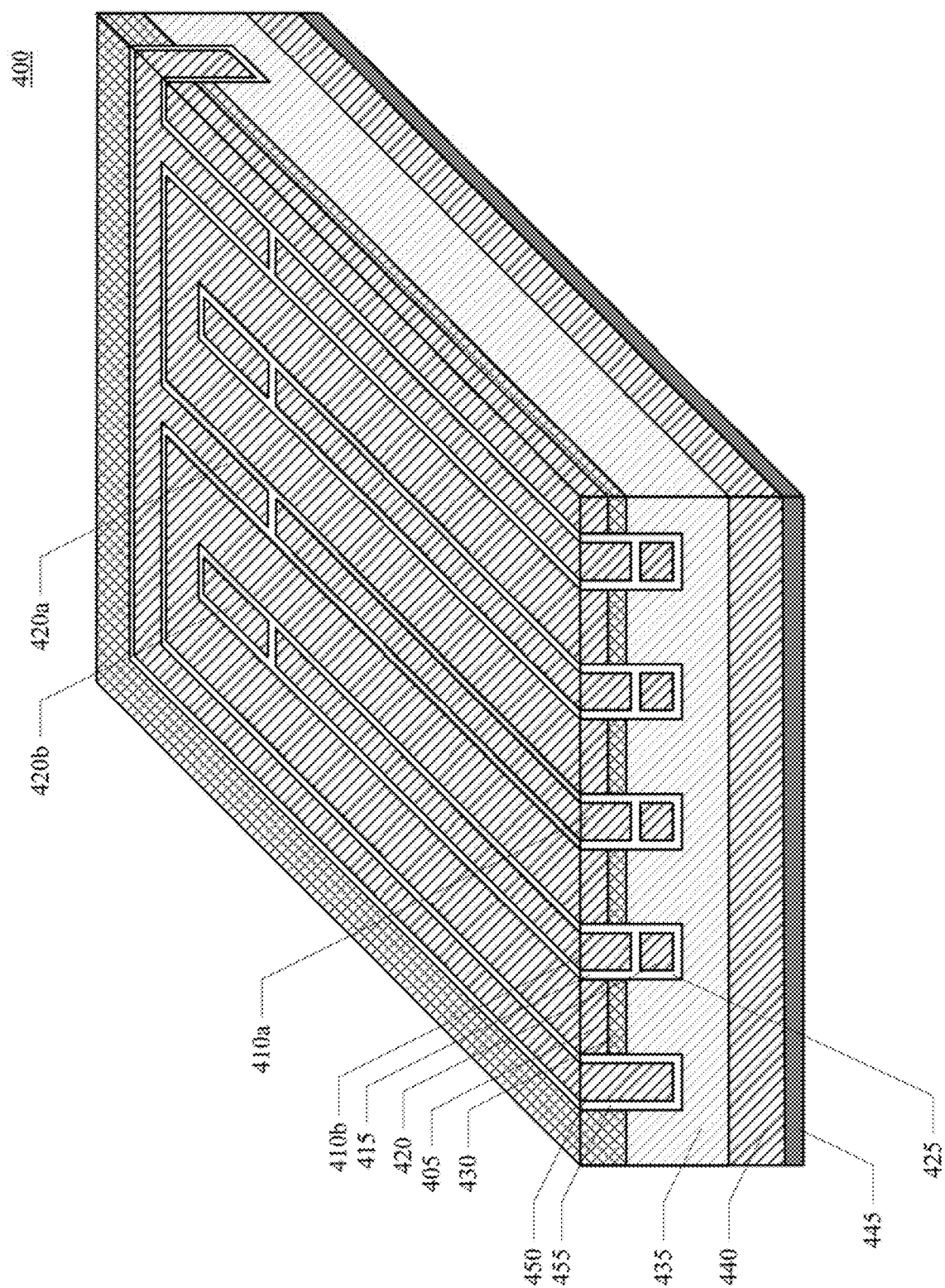
FIG. 4 shows a perspective view of an exemplary Metal-Oxide-Semiconductor Field Effect Transistors (MOSFETs), in accordance with aspects of the present technology.

Referring now to FIG. 4, a perspective view of an exemplary vertical transistor, in accordance with aspects of the present technology, is show. In one implementation, the vertical transistor can be a Metal-Oxide-Semiconductor Field Effect Transistors (MOSFETs) 400. The MOSFET 400 can include one or more source regions 405, one or more gate regions 410, one or more gate insulator regions 415, one or more gate shield regions 420, one or more gate shield insulator regions 425, one or more body regions 430, one or more drift regions 435, one or more drain regions 440, one or more drain contacts 445 one or more termination regions 445, and one or more termination insulator regions 450. Other regions not illustrated can include one or more trace layers, one or more vias, one or more insulator layers, one or more passivation layers, one or more gate contacts, one or more ring structure contacts, one or more source/body contacts, and the like.

In one implementation, a drift region 435 can be disposed between a drain region 440 and the body region 430. A plurality of source regions 405, a plurality of gate regions 410, a plurality of gate insulator regions 415, a plurality of gate shield regions 420 and a plurality of gate shield insulator regions 425, can be disposed within the body region 430 and drift region 435. The gate region 410 and gate shield region 420 can be formed as a plurality of parallel elongated cell structures. The gate insulator region 415 can surround the gate regions 410 and the shield insulator region 425 can surround the gate shield regions 415. Thus, the gate regions 410 and gate shield regions 420 are electrically isolated from the surrounding source regions 405, body region 430 and drift region 435 by the gate insulator regions 415 and gate shield insulator regions 425. The source regions 405 can be formed along the periphery of the gate insulator regions 415. The source regions 405 can be separated from the drift region 435 and drain region 440 by the body region 430. The source regions 405, the body region 430 and the gate shield region 420 can be electrically coupled to the termination region 450 (not shown). The drain contact 445 can be disposed on the drain region 440. One or more trace layers, one or more vias, one or more insulator layers, one or more passivation layers (not shown) can be disposed over the gate regions 410, the source regions 405, the body regions 430, and the one or more termination region 450.

The termination region 450 and termination insulator region 455 can be disposed in a periphery region surrounding the core region that includes the one or more source regions 405, one or more gate regions 410, one or more gate insulator regions 415, one or more gate shield regions 420, one or more gate shield insulator regions 425 and one or more body regions 430. The gate regions 410 and gate shield regions 420 can extend to the termination region 450 in a prescribed pattern. In one implementation, a first set of the gate shield regions 420a, at the ends of a corresponding set of gate regions 410a, can extend fully to the termination region 450. A second set of the gate shield regions 420b, at the ends of a corresponding other set of gate regions 41b can have a predetermined gap disposed between the second set of the gate shield regions 420b and the termination region 450. For example, every other gate shield region 420a can extend to the termination region 450, while the other gate shield regions 420b can be separated from the termination region 450 by a predetermined width $w_m$.

Figure 5:
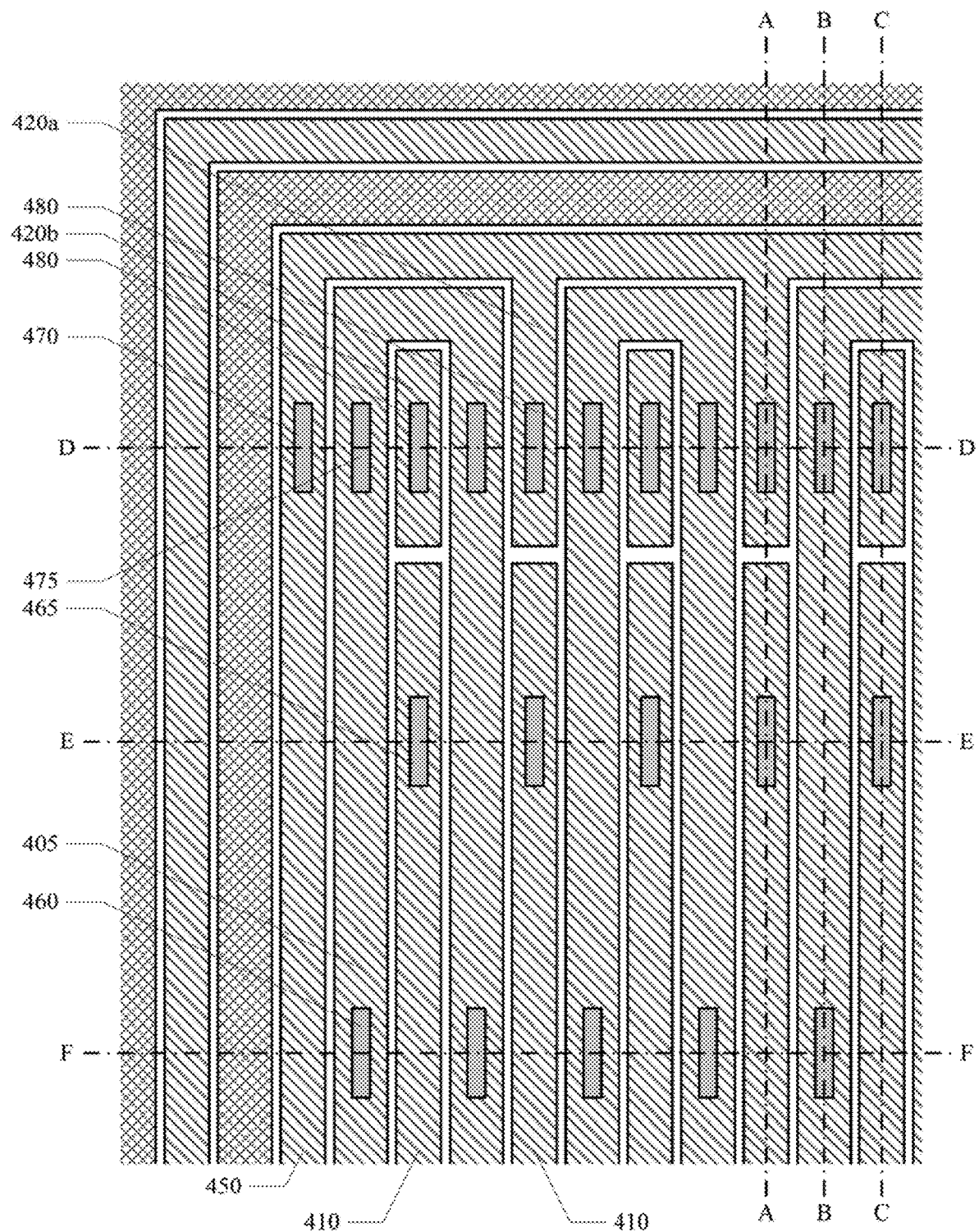
FIG. 5 shows a top view of the exemplary MOSFET, in accordance with aspects of the present technology.

Referring now to FIG. 5, a top view of the exemplary MOSFET, in accordance with aspects of the present technology, is show. Again, the MOSFET 400 can include one or more source regions 405, one or more gate regions 410, one or more gate shield regions 420, and one or more termination region 450. As illustrated in FIG. 5, the gate shield regions 420 can be brought up at the end of the gate regions 410. A first set of the gate shield regions 420a can extend fully to the termination region 450, and a predetermined gap can be disposed between a second set of the gate shield regions 420b and the termination region 450.

FIG. 5, also illustrated a plurality of source body contacts 460 for making a low impedance contact to the source regions 405 and body regions 430. The plurality of source-body contacts 460 can be electrically coupled to a source pad (not shown). In addition, a plurality of gate contacts 465 for making a low impedance contact to the gate regions 410 are illustrated. The plurality of gate contacts 465 can be electrically coupled to a gate line trace (not shown). The MOSFET 400 can also include a plurality of termination contacts 470, a plurality of source/body contacts 475 and a plurality of gate shield contacts 480. The terminations contacts 470, plurality of source/body contacts 475 and plurality of gate shield contacts 480 can be electrically coupled to a termination/source/body/gate shield pickup trace (not shown).

Figure 6:
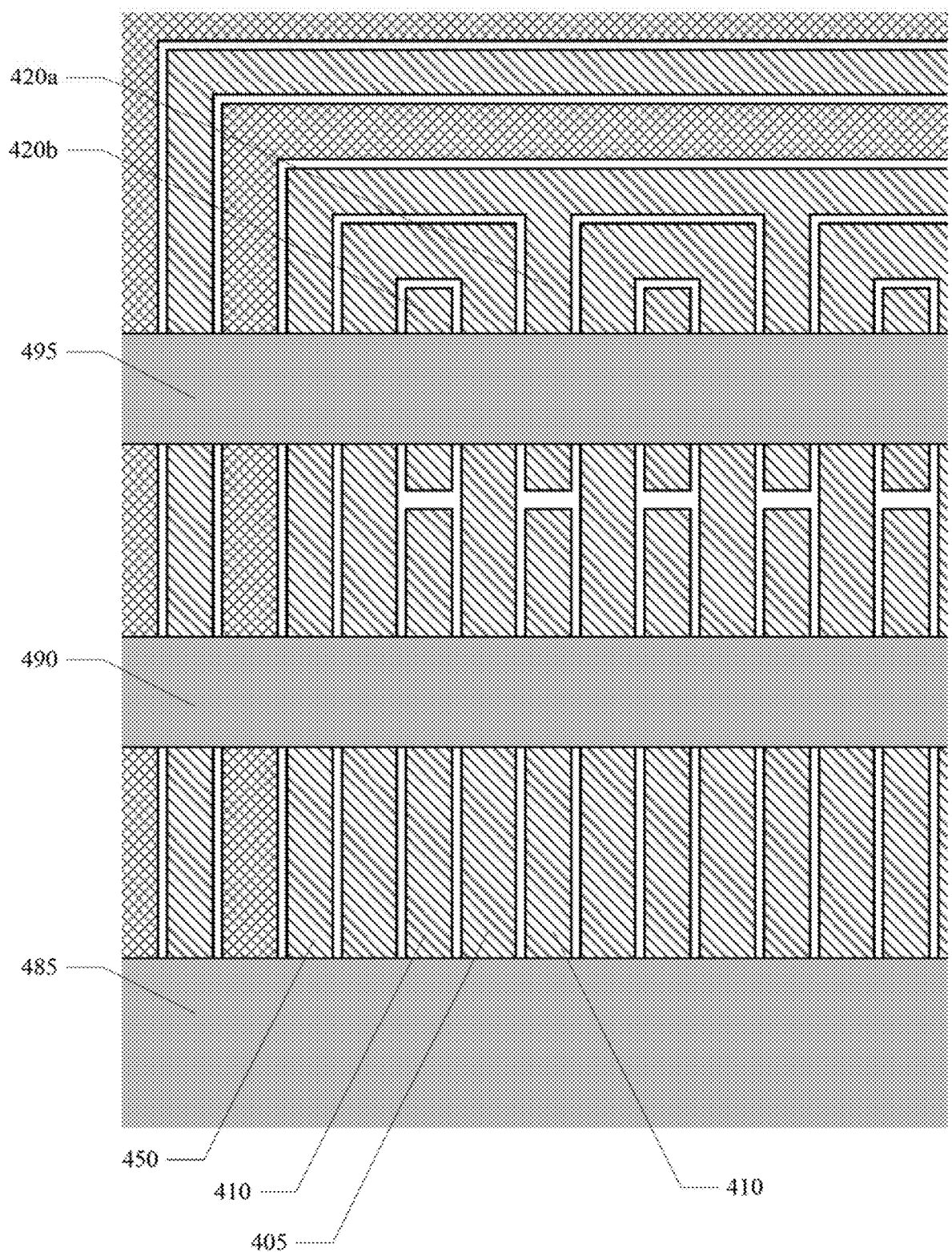
FIG. 6 shows a top view of the exemplary MOSFET, in accordance with aspects of the present technology.

Referring now to FIG. 6, a top view of the exemplary MOSFET, in accordance with aspects of the present technology, is show. FIG. 6 substantially illustrate the same MOSFET as illustrated in FIG. 5. In addition, FIG. 6 illustrates the source pad 485, the gate line trace 490 and the termination/source/body/gate shield pickup trace 495 for electrically coupling the respective sets of contacts (not shown). The termination/source/body/gate shield pickup trace 495 electrically connects the gate shield region 415, the source region 405, the body region 425, termination region 445, and source pad 485 via the source region 405.

Figure 7:
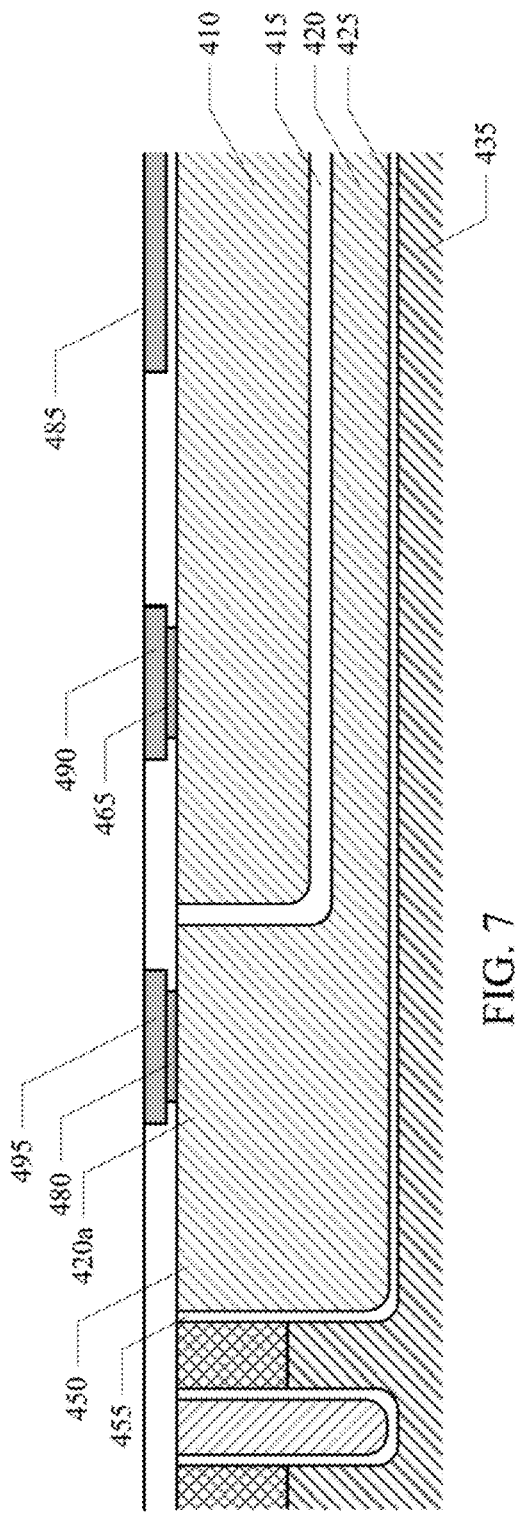
FIG. 7 shows a side view of the exemplary MOSFET, in accordance with aspects of the present technology.

Referring now to FIG. 7, a side view of the exemplary MOSFET, in accordance with aspects of the present technology, is shown. FIG. 7 illustrates the MOSFET along cutline A-A in FIG. 5, that includes one or more gate region 410, one or more gate insulator regions 415, one or more gate shield regions 420, one or more gate shield insulator regions 425, one or more drift regions 435, one or more termination region 450 and one or more termination insulator regions 455. As illustrated in FIG. 7, the given gate shield region 420a along cutline A-A extends fully to the termination region 450. The given gate shield region 420a is brought up to the surface and connects to the termination/source/body/gate shield pickup trace 495 via the gate shield contact 480. FIG. 7 also illustrates the source pad 485, and the gate contact 465 and gate line trace 490.

Figure 8:
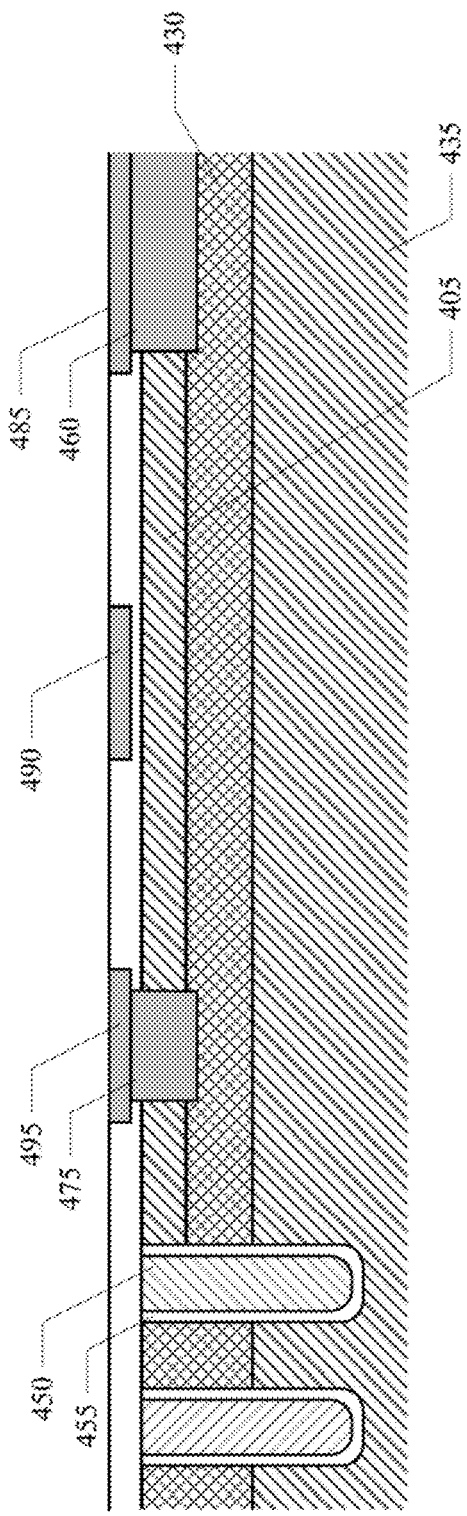
FIG. 8 shows a side view of the exemplary MOSFET, in accordance with aspects of the present technology.

Referring now to FIG. 8, a side view of the exemplary MOSFET, in accordance with aspects of the present technology, is shown. FIG. 8 illustrates the MOSFET along cutline B-B in FIG. 5, that includes one or more source regions 405, one or more body regions 430, one or more drift regions 435, one or more termination regions 450 and one or more termination insulator region 455. FIG. 8 also illustrates the source-body contact 460 and source pad 485, the gate line trace 490, and the source-body contact 475 and termination/source/body/gate shield pickup trace 495.

Figure 9:
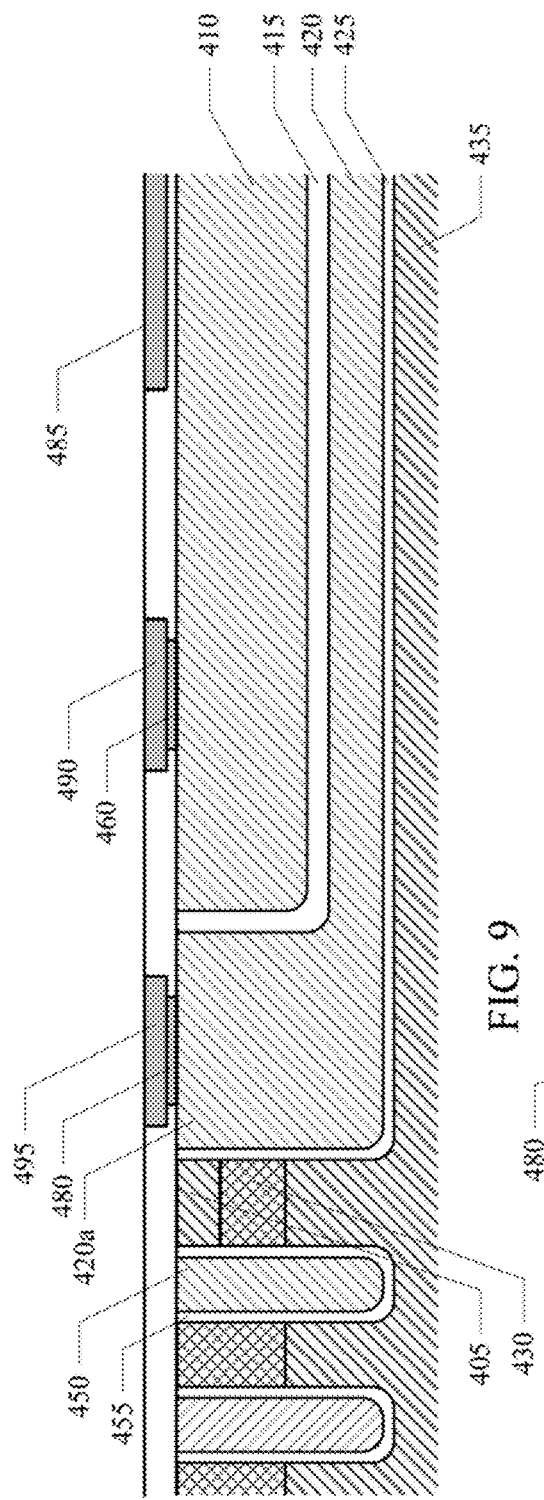
FIG. 9 shows a side view of the exemplary MOSFET, in accordance with aspects of the present technology.

Referring now to FIG. 9, a side view of the exemplary MOSFET, in accordance with aspects of the present technology, is shown. FIG. 9 illustrates the MOSFET along cutline C-C in FIG. 5, that includes one or more gate region 410, one or more gate insulator regions 415, one or more gate shield regions 420, one or more gate shield insulator regions 425, one or more body regions 430, one or more drift regions 435, one or more termination region 450 and one or more termination insulator regions 455. As illustrated in FIG. 9, the given gate shield region 420 along cutline C-C does not extend fully to the termination region 450. There is a mesa gap between the given gate shield region 420 and the termination region 450. The gate shield region 420 is brought up to the surface at the end of the gate region 410 and connects to the termination/source/body/gate shield pickup trace 495 via the gate shield contact 480. FIG. 9 also illustrates the source pad 485, the gate contact 460 and gate line trace 490.

Figure 10:
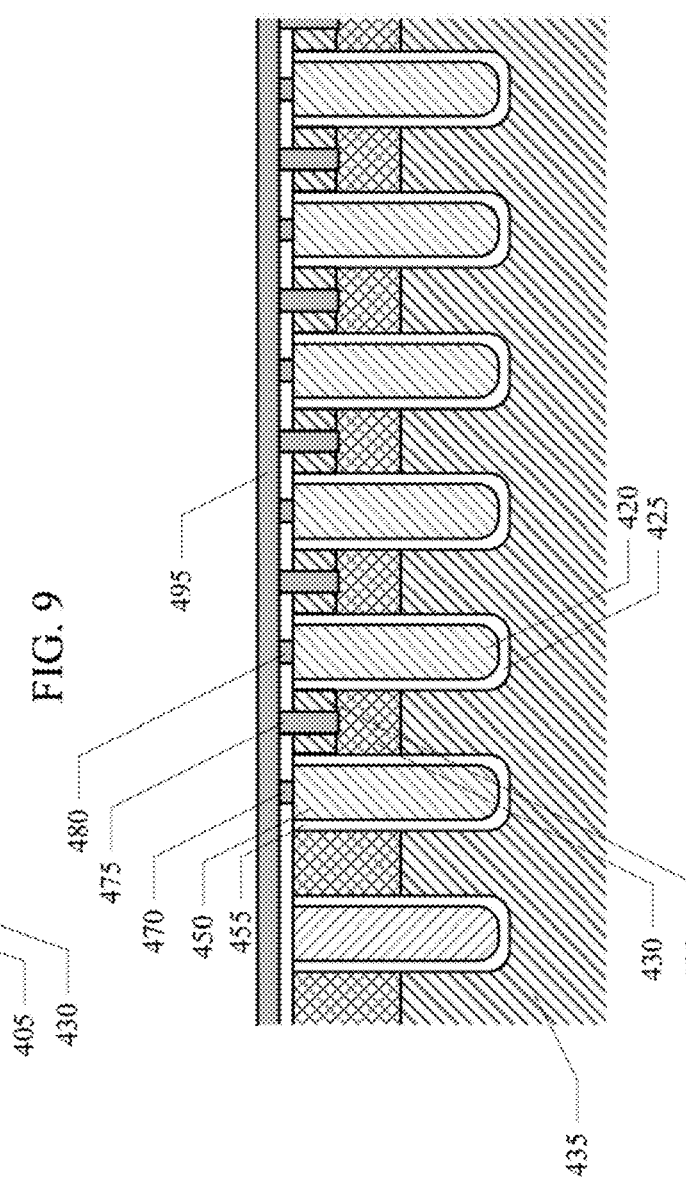
FIG. 10 shows a side view of the exemplary MOSFET, in accordance with aspects of the present technology.

Referring now to FIG. 10, aside view of the exemplary MOSFET, in accordance with aspects of the present technology, is shown. FIG. 10 illustrates the MOSFET along cutline D-D in FIG. 5, that includes one or more source regions 405, one or more gate shield regions 420, one or more gate shield insulator regions 425, one or more body regions 430, one or more drift regions 435, one or more termination regions 450 and one or more termination insulator regions 455. The gate shield region 420 is brought up to the surface and connect to the termination/source/body/gate shield pickup trace 495 via the gate shield contact 480 no matter if the gate shield regions 420 are fully extended to the termination region 450 or not. FIG. 10 also illustrates the plurality of termination contacts 470 and source/body contacts 475 coupled to the termination/source/body/gate shield pickup trace 495.

Figure 11:
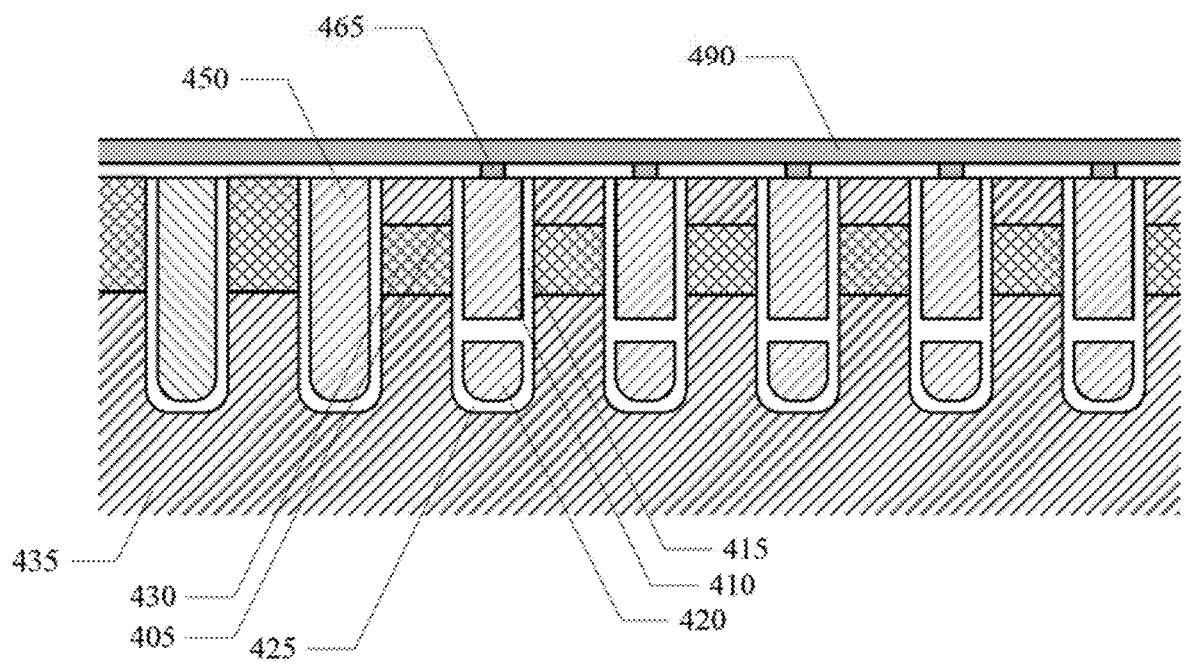
FIG. 11 shows a side view of the exemplary MOSFET, in accordance with aspects of the present technology.

Referring now to FIG. 11, a side view of the exemplary MOSFET, in accordance with aspects of the present technology, is shown. FIG. 11 illustrates the MOSFET along cutline E-E in FIG. 5, that includes one or more source regions 405, one or more gate regions 410, one or more gate insulator regions 415, one or more gate shield regions 420, one or more gate shield insulator regions 425, one or more body regions 430, one or more drift regions 435, one or more termination regions 450 and one or more termination insulator regions 455. FIG. 11 also illustrates the plurality of gate contacts 465 and the gate line trace 490.

Figure 12:
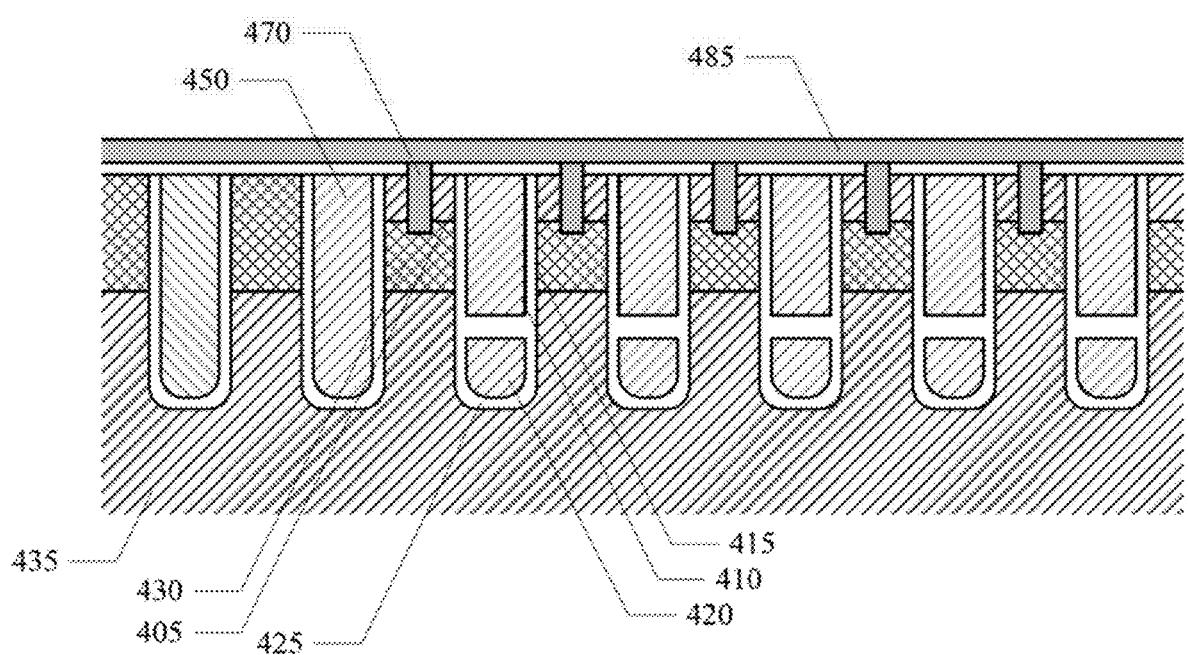
FIG. 12 shows a side view of the exemplary MOSFET, in accordance with aspects of the present technology.

Referring now to FIG. 12, a side view of the exemplary MOSFET, in accordance with aspects of the present technology, is shown. FIG. 12 illustrates the MOSFET along cutline F-F in FIG. 5, that includes one or more source regions 405, one or more gate regions 410, one or more gate insulator regions 415, one or more gate shield regions 420, one or more gate shield insulator regions 425, one or more body regions 430, one or more drift regions 435, one or more termination regions 450 and one or more termination insulator regions 455. FIG. 12 also illustrates the plurality of source-body contacts 470 and the source pad 485.

In the above described exemplary implementation of the MOSFET 400, every other gate shield region 420a extends fully to the inner termination region 450 surrounding the active area and forms a T-shaped connection. Between every two fully extended gate shield regions 420a, the other gate shield regions 420b end with a gap we to the adjacent perpendicular termination region 450.

Figure 13:
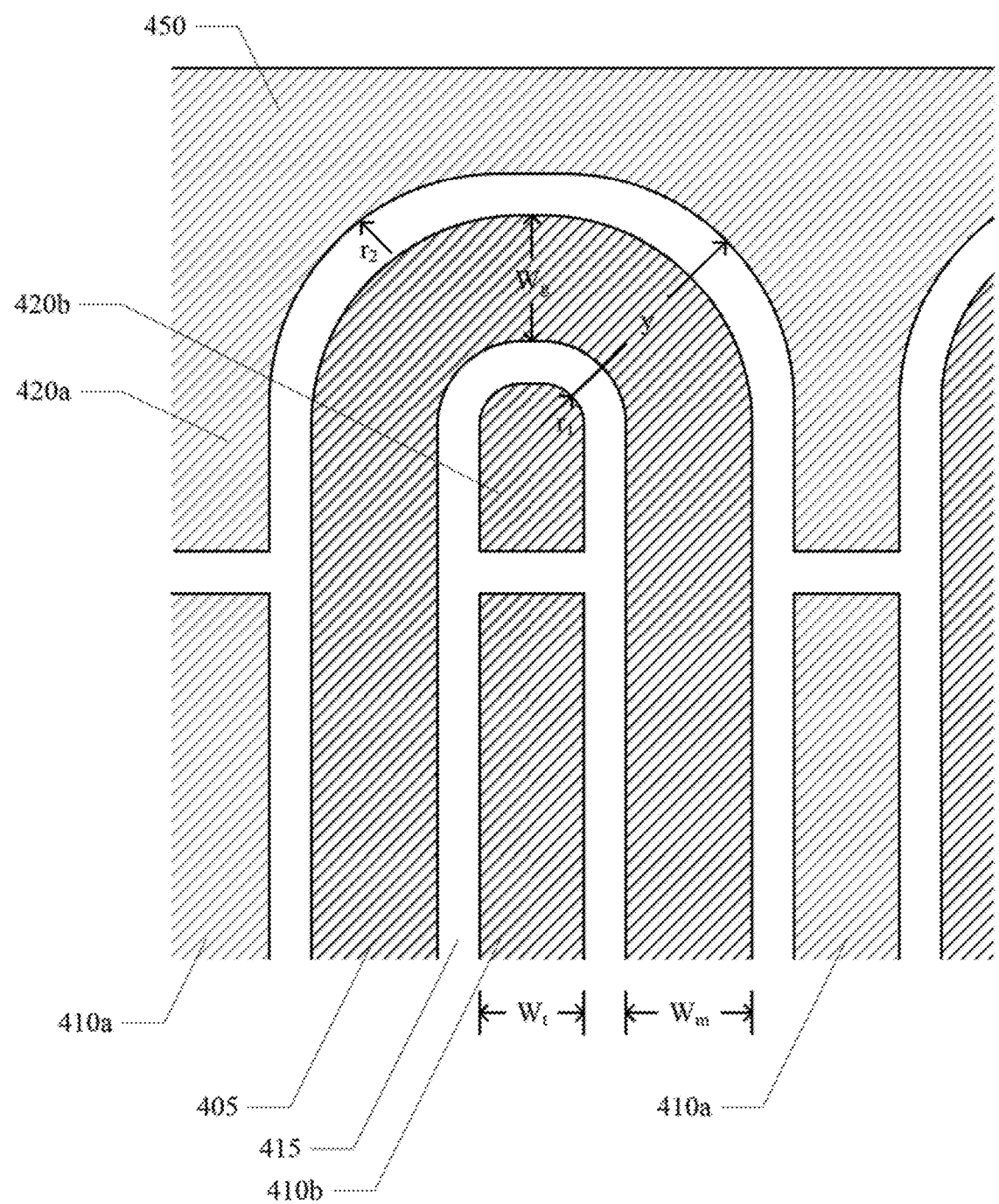
FIG. 13 shows a top view of the exemplary MOSFET, in accordance with aspects of the present technology.

Referring now to FIG. 13, a top view of the exemplary MOSFET, in accordance with aspects of the present technology, is shown. FIG. 13 illustrates an enlarged view of an edge or a corner of the active area including a gate shield region 420b that ends with a gap to the adjacent termination region 450 and a portion of two adjacent gate shield regions 420a that fully extends to the termination region 450. The gate shield region 420b that does not extend fully to the termination region 450 is brought up to the surface at the end of the gate region 410b. In one implementation, the corners of the gate shield region 420b that end with a gap to the adjacent termination region 450 can be rounded with a radius $r_1$. In addition, the inside corners of where gate shield regions 420a extend fully to the termination region 450 can be rounded with a radius $r_2$. The gap between the gate shield region 420b that do not extend fully to the adjacent termination region 450 can be $w_g$. The width of the gate regions 410 can be wt, and the width between two adjacent gate region 410 can be win. When a reverse bias is applied to the MOSFET, the doped semiconductor between the gate shield regions 420 can be depleted under the shield effect from the gate shield regions 420 with a net charge of Qn. Correspondingly, there is an opposite charge $Q_t$ in the gate shield regions 420 adjacent the gate shield insulator region 425. Because the gate shield region 420 is highly doped with a low resistivity, the charge $Q_t$ can be evenly distributed along the length of the gate shield regions 420. The MOSFET can reach a maximum breakdown voltage when the two types of charges $Q_t$ and $Q_n$ are balanced.

At the diagonal separation y between the corners of the gate shield region 420b that do not extend to the termination region 450 and the corners between the perpendicular termination region 450 and the gate shield regions 420a that fully extend to the termination region 450, the charge in the doped semiconductor between the gate shield regions is balanced by the shield effects from surrounding termination region 450 and gate shield regions 420a and 420b that extend to the termination region 450. When the separation y on the diagonal direction is increased, the shield effect from the corners of gate shield regions 420b that does not fully extend to the termination region 450 becomes weak, while the shield effect from the perpendicular termination region 450 and the gate shield regions 420a that fully extend to the termination region 450 increases, and vice versa. Therefore, the under-shield or over-shield problem in the convention art is reduced or eliminated.

Figure 14:
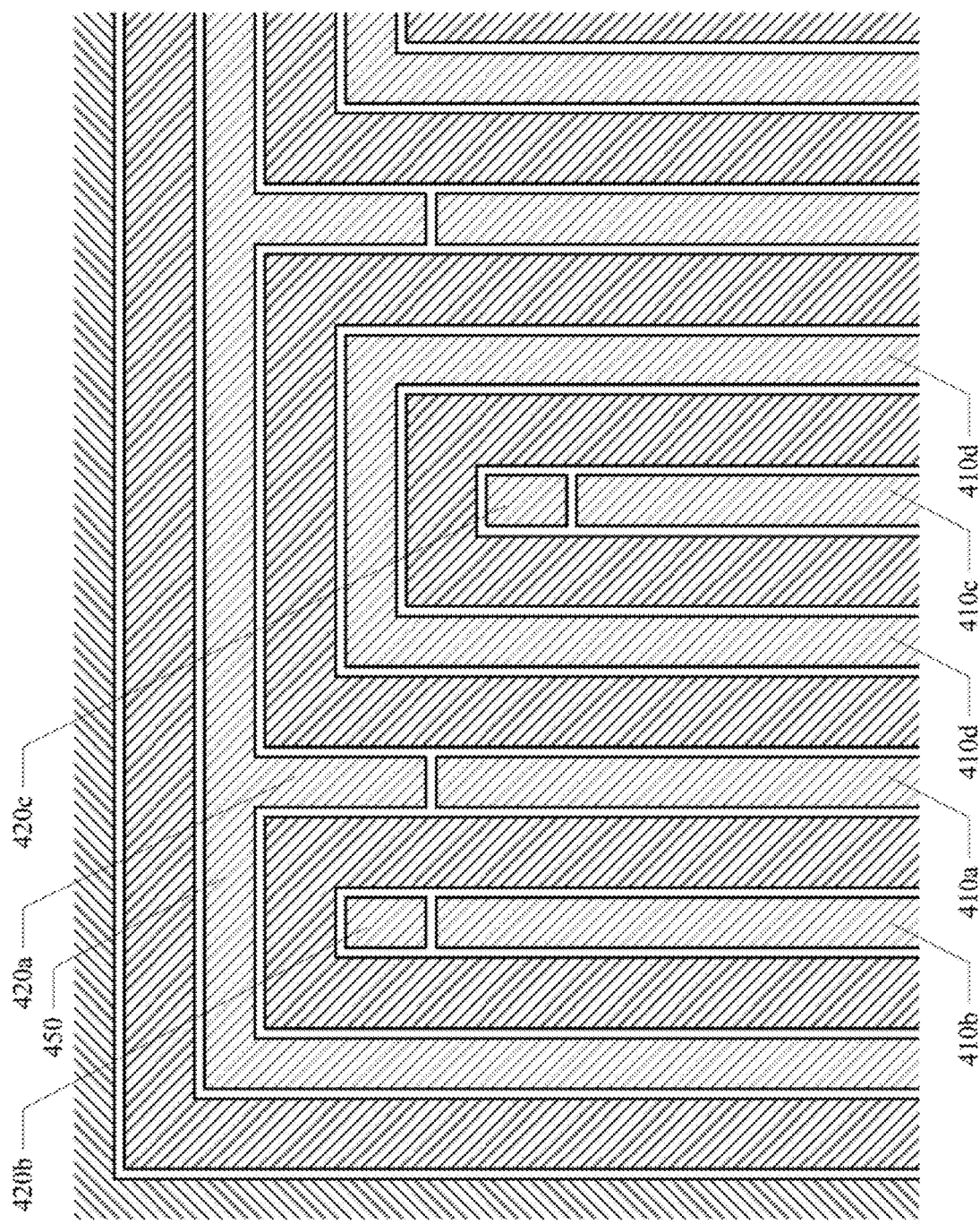
FIG. 14 shows a top view of the exemplary MOSFET, in accordance with aspects of the present technology.

The gate shield region 420 can extend to the termination region 450 in various prescribed pattern. Referring now to FIG. 14, a top view of the exemplary MOSFET, in accordance with aspects of the present technology, is show. As illustrated in FIG. 14 another prescribed pattern can include a plurality of gate regions 410 and gate shield regions 420 arranged in parallel in the core area. In the area proximate the termination region 450, a given gate region 410c and gate shield region 420c can be surrounded by one or more other gate regions 410d and gate shield regions. The gap between the end of the given gate shield region 420c and the surrounding other gate region 410d and gate shield region can be substantially equal to the distance between the adjacent parallel portions in the core area. The pattern of surrounding gate structures can also be combined with the alternating pattern of fully extending gate shield region 420a and non-fully extending gate shield regions 420b as described above with reference to FIGS. 4-12, and/or the rounded corners described above with reference to FIG. 13.

Figure 15:
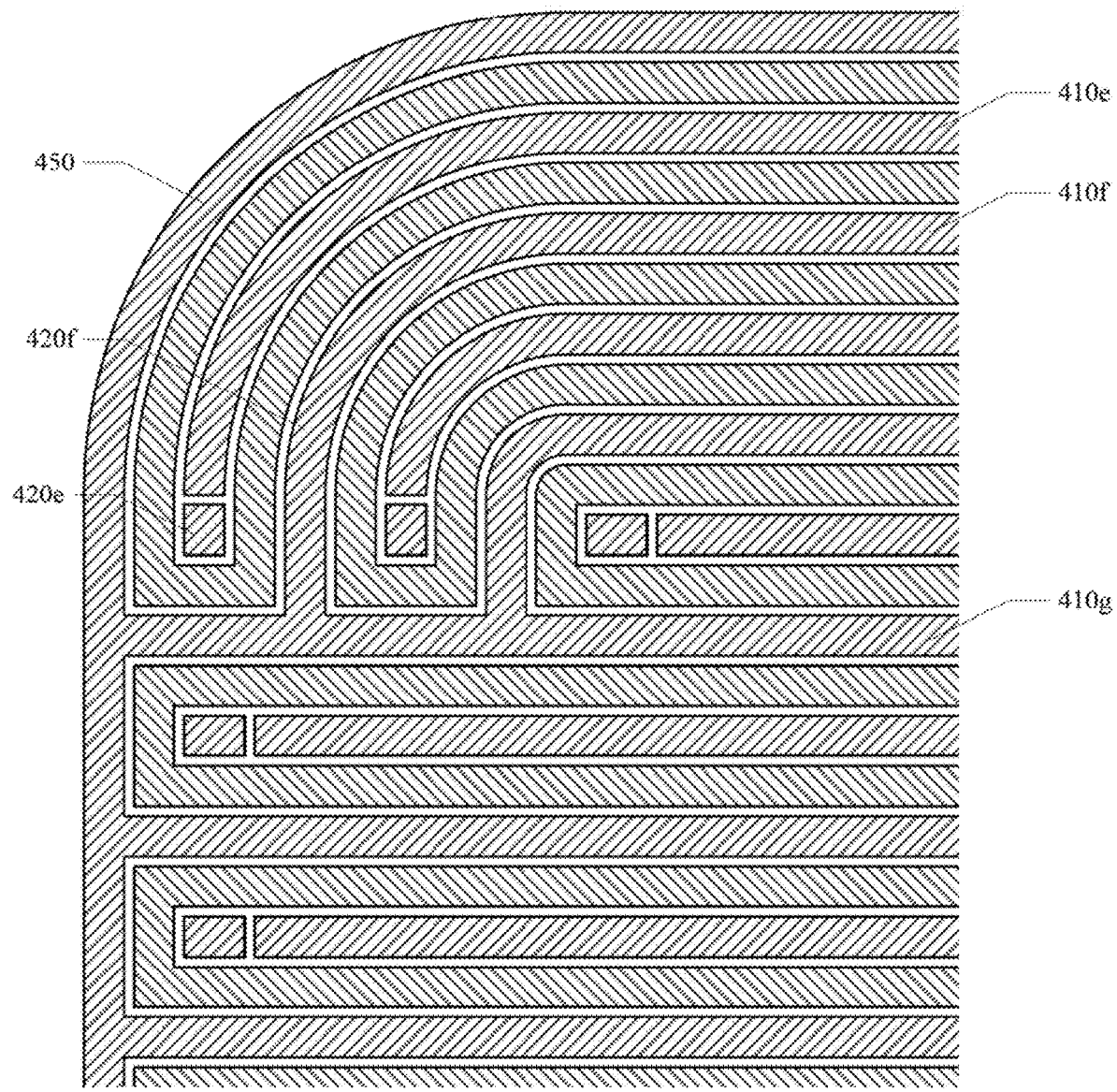
FIG. 15 shows a top view of the exemplary MOSFET, in accordance with aspects of the present technology.
Figure 16:
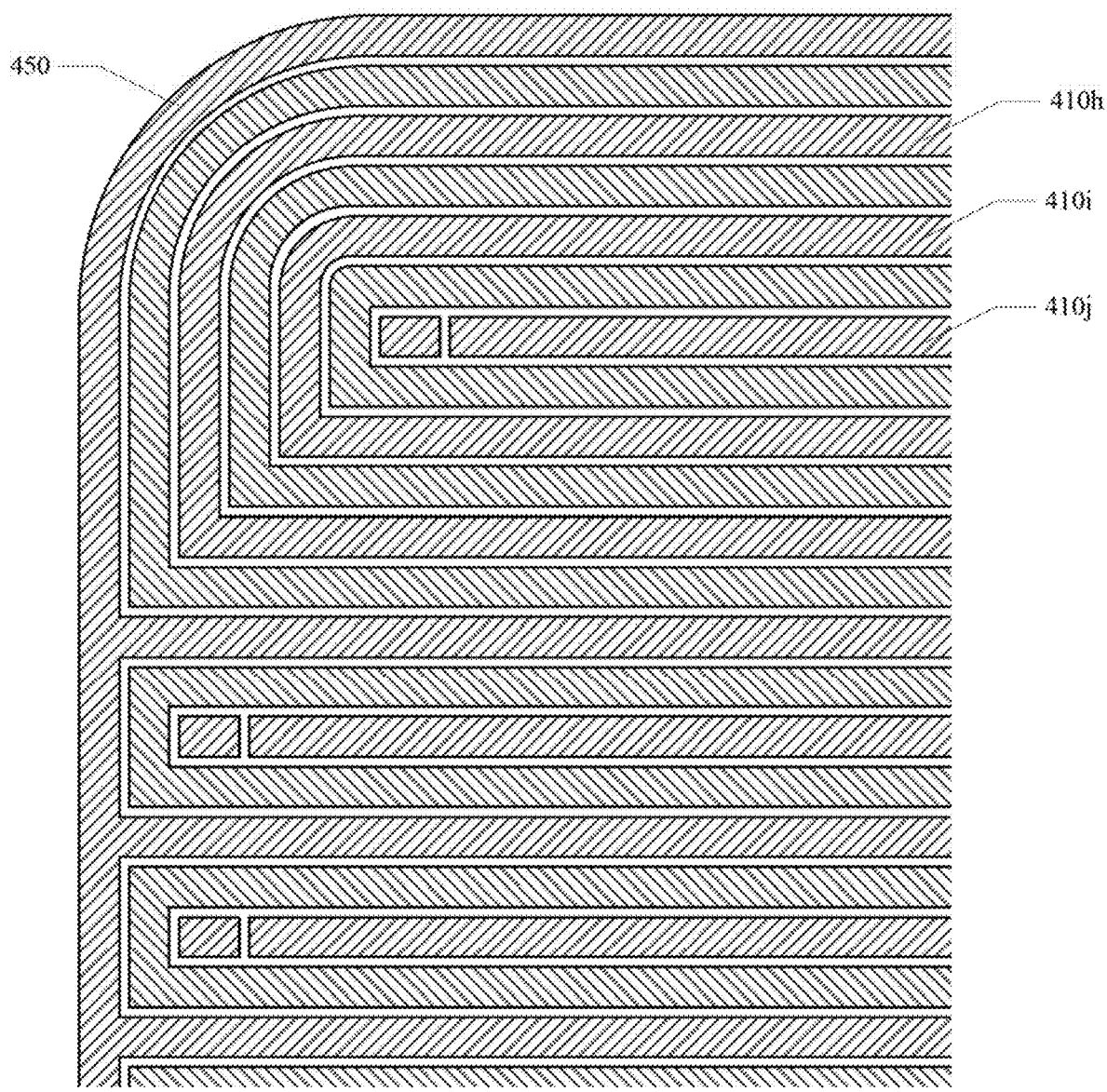
FIG. 16 shows a top view of the exemplary MOSFET, in accordance with aspects of the present technology.

Referring now to FIGS. 15 and 16, a top view of the exemplary MOSFET, in accordance with aspects of the present technology, is shown. As illustrated in FIG. 15 another prescribed pattern can include a curved termination region 450 and one or more curved gate regions 410e, 410f, and curved gate shield regions 420e, 420f, in corner regions of the MOSFET. The curved termination region 450 and one or more curved gate shield regions 420e, 420f, can be configured to reduce electric field crowding in device corners. The gap between adjacent gate shield regions 420, and between gate shield regions 420 and adjacent portions of the termination region 450 can be configured to be substantially equal at both the ends of the gate shield regions 420 and along the lengths of the gate shield regions 420. In one implementation, the curved gate regions 410e, 410f, and the curved gate shield regions 420e, 420f in the corner regions can be arranged in an alternating pattern of extending fully and not extending fully to another one of the gate region 410g and gate shield region, as illustrated in FIG. 15. In another implementation, the curved gate regions 410h, 410i, 410j and curved gate shield regions in the corner regions can be arranged in surrounding patterns, as illustrated in FIG. 16. The pattern of curved gate regions 410, curved gate shield regions 420 and curved termination region 450 at the corner regions of the MOSFET can be combined with the alternating pattern of fully and non-fully extending gate structures described above with reference to FIGS. 4-12, the pattern of curved corners described above with reference to FIG. 13, and or the pattern of surrounding gate structures as described above with reference to FIG. 14.

Figure 17A:
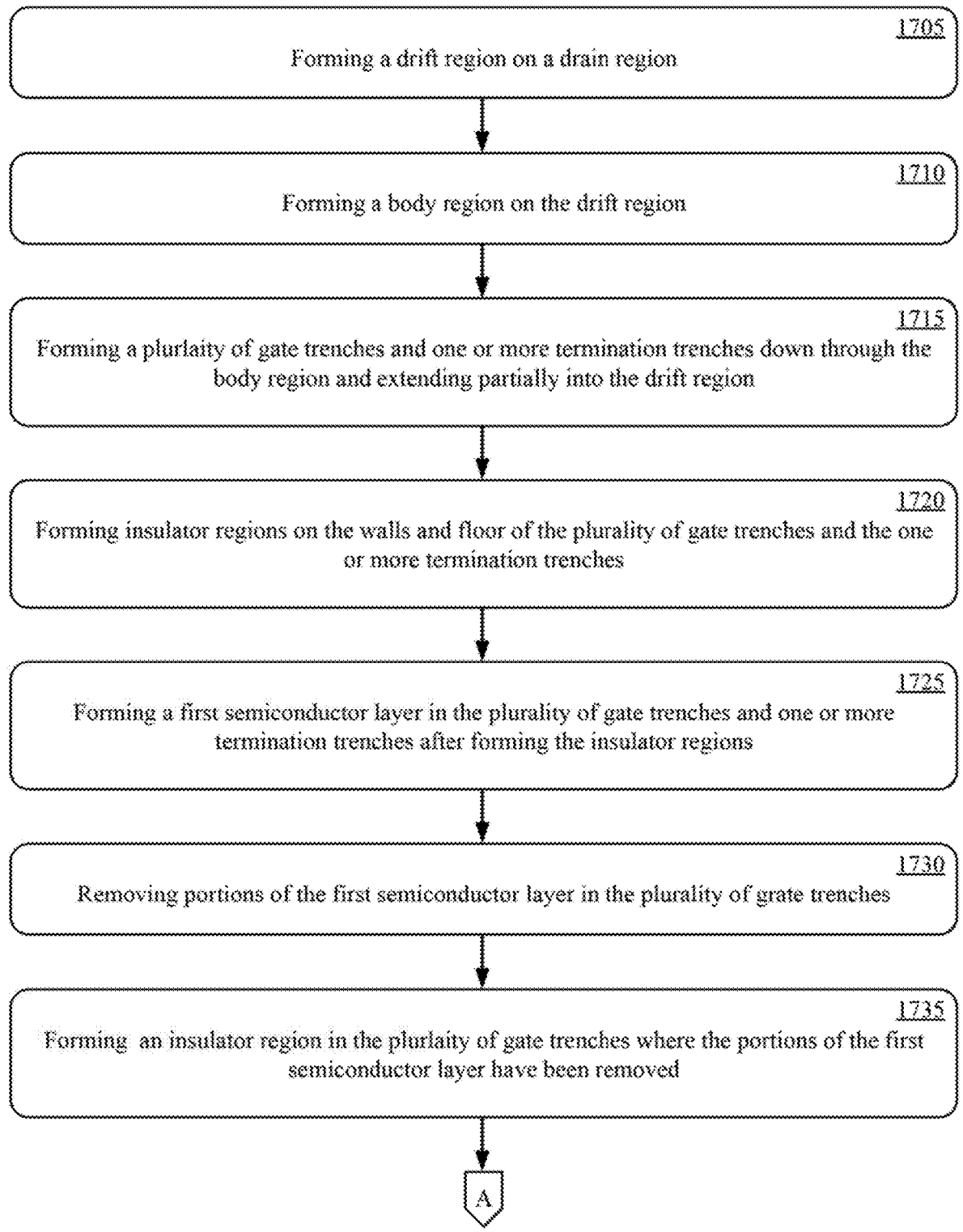
FIGS. 17A and 17B show a method of fabricating a MOSFET, in accordance with aspects of the present technology.
Figure 17B:
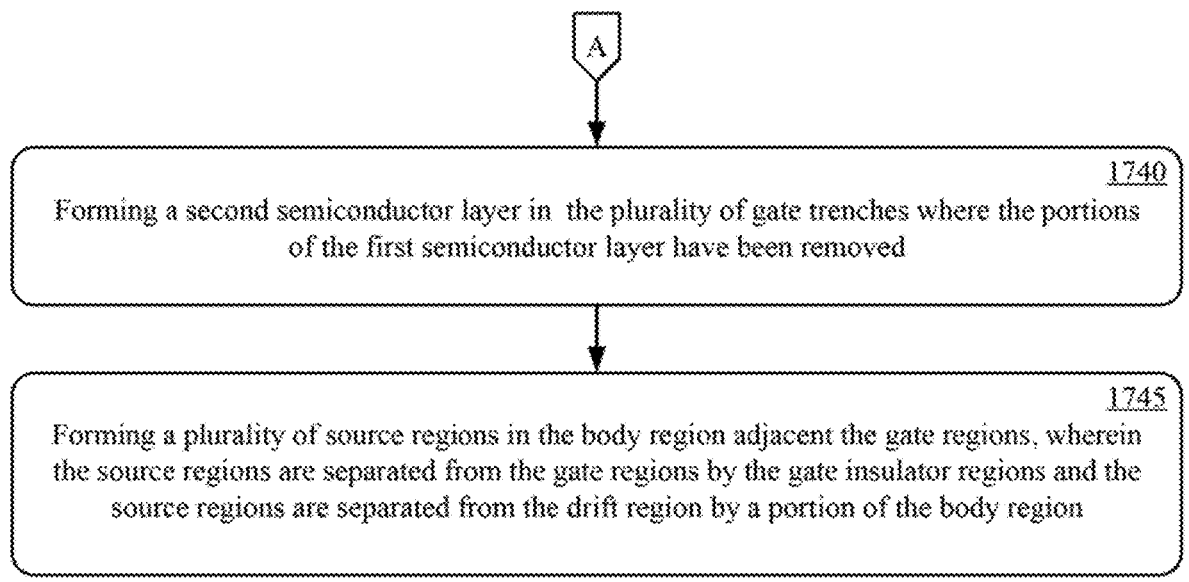

Referring now to FIGS. 17A and 17B, a method of fabricating a MOSFET, in accordance with aspects of the present technology, is shown. The method can begin with various initial processes upon a semiconductor wafer, such as cleaning, depositing, doping, etching and or the like. In one implementation, the wafer can be a heavily n-doped (N+) semiconductor, such as silicon doped with phosphorous or arsenic that forms a drain region. At 1750, a drift region can be formed on the drain region. In one implementation, the drift region can be formed by epitaxially depositing a moderately or lightly n-doped (N or N−) semiconductor, such as silicon doped with phosphorous or arsenic on the drain region.

At 1710, a body region can be formed on the drift region. In one implementation, a dopant such as boron can be implanted in an upper portion of the epitaxial deposited semiconductor layer to form a p-doped (P) semiconductor body region above the optional drift region.

At 1715, a plurality of gate trenches and one or more termination trenches can be formed through the body region. The plurality of gate trenches and the one or more termination trenches can extend partially into the drift region. In one implementation, a trench mask can be formed on the body region. The portions of the body region exposed by the trench mask can be etched to form the plurality of gate trenches and the one or more termination trenches in the body region. In another implementation, separate gate and termination trench mask and etching processes can be used to form gate and termination trenches with different widths and or different depths. In one implementation, the width and or depth of the termination trench can be between one hundred percent and one hundred and twenty percent of the gate trenches.

The plurality of gate trenches can be arranged as a plurality of parallel trenches separated from each other by a first predetermined spacing $w_m$. In one implementation, a termination trench can be formed in a ring surrounding the plurality of gate trenches. In one implementation, a first set of the plurality of gate trenches extend fully to the termination trench and the ends of a second set of the plurality of trenches can be separated from the termination trench by a second predetermined spacing $w_g$. The trenches of the first set and second set can be arranged in an alternating pattern. In one implementation, the second predetermined spacing $w_g$ can be between 100 and 60 percent of the first predetermined spacing $w_m$. The alternating pattern of fully and non-fully extending gate trenches can result in gate regions as illustrated in FIGS. 4-12

In another implementation, the corners at the ends of the gate trenches that do not fully extend to the termination trench can be rounded. In addition, the inside corners of the intersection of the termination trench and the gate trenches that fully extend to the termination trench can be rounded. The rounded corner of the trenches can result in the combination of gate regions and termination region as illustrated in FIG. 13.

In another implementation, the plurality of gate trenches can be arranged in parallel in a core area. In the area proximate the termination trench each of first set of gate trenches can be surrounded by one or more of a second set of gate trenches. The pattern of surrounding gate trenches can result in gate regions as illustrated in FIG. 14.

In another implementation, the termination trench can be curved in the corner regions of the MOSFET. The plurality of gate trenches can also be curved in the corner regions. In one implementation, the gate trenches in the corner regions can be curved in an alternating pattern of fully extending and non-fully extending trenches to another one of the gate trenches. The alternating pattern of curved fully extending and non-fully extending trenches in the corner regions can result in the gate regions and termination region as illustrated in FIG. 15. In another implementation, the gate trenches in the corner regions can be arranged as one or more gate trenches that surround one or more other trenches in the corner regions. The surrounding gate trenches in the corner regions can result in the combination of gate regions and termination region as illustrated in FIG. 16.

At 1720, a first insulator regions can be formed on the walls and floor of the plurality of gate trenches and the one or more termination trenches. In one implementation, the surface of the gate trenches and one or more termination trenches can be oxidized to form a gate shield insulator region in the plurality of gate trenches and a termination insulator region in the one or more termination trenches.

At 1725, a first semiconductor layer can be formed on the insulator region in the plurality of gate trenches and one or more termination trenches. In one implementation, a heavily n-doped (N+) semiconductor, such as polysilicon doped with phosphorous or arsenic, can be deposited in the plurality of gate trenches, the one or more termination trenches and on the surface of the body region. Excess portions of the deposited semiconductor and the oxide layer formed over the surface of the body region can then be removed by etching until the portions of the deposited semiconductor and the oxide layer disposed in the gate trenches remain.

At 1730, a portion of the first semiconductor layer in a core area of the plurality of gate trenches can be removed. In one implementation, a photo resist is deposited and patterned to form a gate region mask exposing an area of the first semiconductor layer in the core area. A portion of the first semiconductor layer in the core area exposed by the mask can etched back to form a gate shield region in the plurality of gate trenches in the core area and extending to the top of the gate trenches proximate the termination trench. The gate region mask can be removed after the first semiconductor layer in the core area is etched back.

At 1735, a second insulator region can be formed on the remaining portion of the first semiconductor layer. In one implementation, a relatively thick insulator can be formed on the surface of the remaining portion of the first semiconductor layer and on the walls of the exposed portion of the trench. The relatively thick insulator can be removed from the wall of the exposed portion of the trench and then a relatively thin insulator region can be formed on the side wall to form the gate insulator region.

At 1740, a second semiconductor layer can be formed on the second insulator region where the portion of the first semiconductor layer in a core area of the plurality of gate trenches was removed. In one implementation, a heavily n-doped (N+) semiconductor, such as polysilicon doped with phosphorous or arsenic, can be deposited in the plurality of gate trenches where the portion of the first semiconductor layer in a core area was removed, on the termination regions and on the surface of the body region. Excess portions of the second semiconductor and the second oxide layer can then be removed by etching until the portions of the deposited second semiconductor and the oxide layer disposed in the portions of the gate trenches remain. The portion of the second semiconductor layer remaining in the plurality of gate trenches where the portion of the first semiconductor layer in a core area was removed can form a plurality of gate regions.

At 1745, a plurality of source regions can be formed in the body region adjacent the gate regions. The source regions can be separated from the gate regions by the gate insulator regions. The source regions can also be separated from the drift region by a portion of the body region. In one implementation, a dopant such as phosphorous or arsenic can be implanted in an upper portion of the body region to form heavily n-doped (+N) semiconductor source regions.

The method of fabricating the MOSFET can continue with various subsequent processes upon the wafer, such as cleaning, depositing, doping, etching and or the like. The subsequent process can form various other structures of the MOSFET, such as contacts, traces, vias, encapsulation layers and the like. The additional subsequent process are not necessary for an understanding of aspects of the present technology and therefore are not further described herein.

Embodiments of the present technology advantageously achieve charge balance in the active area and the termination area of the MOSFET device simultaneously. Therefore, the breakdown voltage of the MOSFET device is advantageously increased. The on-resistance of the MOSFET can also be advantageously reduced by the achieved charge balance. The switching speed can also be increased by the achieved charge balance. The efficiency of the MOSFET can also be increase by the achieved charge balance. The present technology and its embodiments can also be applied to vertical trenched power devices including trench diodes, trench IGBTs, etc.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A Metal-Oxide-Semiconductor Field Effect Transistor (MOSFET) device comprising:
a plurality of gate structures including a plurality of gate regions and a corresponding plurality of gate shield regions, wherein the plurality of gate structures are parallel to each other and separated from each other in a core area; and
one or more termination structures surrounding the plurality of gate structures in a termination area, wherein the plurality of gate shield regions extend to a first termination structure in a predetermined pattern configured to balance charge in the core area and a termination area in a reverse bias condition, wherein the predetermined pattern includes a first set of the plurality of gate shield regions that extend fully to the first termination structure and ends of a second set of the plurality of gate shield that are separated from the first termination structure.

2. The MOSFET of claim 1, wherein:
the plurality of gate structure includes
a plurality of gate regions disposed between a plurality of source regions and body regions;
a plurality of gate shield regions disposed between the plurality of gate regions and a drift region;
a plurality of gate shield insulator region disposed between the plurality of gate shield regions and the drift region; and
a plurality of gate insulator region disposed between the plurality of gate regions and the plurality of gate shield regions, and between the plurality of gate regions and the source regions and body regions.

3. The MOSFET of claim 1, wherein:
the first termination structure includes;
a first termination region surrounding a plurality of source regions, a plurality of body regions and the plurality of gate structures; and
a first termination insulator region disposed about the first termination region.

4. The MOSFET of claim 1, wherein a spacing between the plurality of gate structure is approximately equal to a spacing between ends of the second set of the plurality of gate shield regions and the first termination structure.

5. The MOSFET of claim 1, wherein a spacing between the ends of the second set of the plurality of gate shield regions and the first termination structure is approximately one hundred and forty percent to sixty percent of a spacing between the plurality of gate structures.

6. The MOSFET of claim 1, wherein the width of the first termination structure is approximately between one hundred percent and one hundred and twenty percent of the gate structure.

7. The MOSFET of claim 1, wherein the depth of the first termination structure is approximately between one hundred percent and one hundred and twenty percent of the gate structure.

8. The MOSFET of claim 1, wherein
the ends of the second set of the plurality of gate shield regions are rounded; and
corners at intersections of the first set of the plurality of gate shield regions with the first termination structure are rounded.

9. The MOSFET of claim 1, wherein:
the first termination structure is rounded in corners of the MOSFET;
a third set of the plurality of gate structures are curved to fully extend to a respective one of the first set of the plurality of gate structures adjacent a respective corner of the MOSFET; and
a fourth set of the plurality of gate structures are curved toward but separated from the respective one of the first set of the plurality of gate structures adjacent the respective corner of the MOSFET.

10. The MOSFET of claim 1, wherein:
the first termination structure is rounded in corners of the MOSFET;
one or more gate structures of a third set of the plurality of gate structures surround ends of each respective one of a fourth set of the plurality of gate structures adjacent a respective corner of the MOSFET, wherein the third set of the plurality of gate structures are separated from adjacent ones of the fourth set of the plurality of gate structures and adjacent portions of the first termination structure.

11. A MOSFET device comprising:
a drain region;
a drift region disposed on the drain region;
a plurality of body regions disposed on the drift region opposite the drain region;
a plurality of source regions disposed on the plurality of body regions;
a plurality of gate structures disposed between the plurality of source regions, and extending through the plurality of body regions to the drift region in a core are wherein the plurality of gate structures include a plurality of gate regions and a corresponding plurality of gate shield regions, and wherein the plurality of gate structures are separated from each other in a core area;
a termination structure surrounding the plurality of gate structures, the plurality of source regions and the plurality of body regions in a termination area, wherein a first set of the plurality of gate structures extend fully to the termination structure and ends of a second set of the plurality of gate structures are separated from the termination structure to balance charge in the core area in a reverse bias condition.

12. The MOSFET of claim 11, wherein:
one or more gate structures of a third set of the plurality of gate structures surround ends of each respective one of the second set of the plurality of gate structures in the termination area, wherein the third set of the plurality of gate structures are separated from adjacent ones of the first and second set of the plurality of gate structures and adjacent portions of the termination structure.

13. The MOSFET of claim 11, wherein:
the termination structure is rounded in corners of the MOSFET;
ends of a third set of the plurality of gate structures are curved to fully extend to a respective one of the first set of the plurality of gate structures adjacent a respective corner of the MOSFET; and
ends of a fourth set of the plurality of gate structures are curved toward but separated from the respective one of the first set of the plurality of gate structures adjacent the respective corner of the MOSFET.

14. The MOSFET of claim 11, wherein:
the termination structure is rounded in corners of the MOSFET;

one or more gate structures of a third set of the plurality of gate structures surround ends of each respective one of a fourth set of the plurality of gate structures adjacent a respective corner of the MOSFET, wherein the third set of the plurality of gate structures are separated from adjacent ones of the fourth set of the plurality of gate structures and adjacent portions of the termination structure.

15. The MOSFET of claim 11, wherein:
the plurality of gate structure includes;
   a plurality of gate insulator region disposed about the plurality of gate regions; and
   a plurality of gate shield insulator region disposed about the plurality of gate shield regions;
   the plurality of gate regions are disposed between a plurality of source regions and body regions;
   the plurality of gate shield regions are disposed between the plurality of gate regions and a drift region; and
the termination structure includes;
   a termination region; and
   a termination insulator region disposed about the termination region.

16. A Metal-Oxide-Semiconductor Field Effect Transistor (MOSFET) device comprising:
   a plurality of gate structures including a plurality of gate regions and a corresponding plurality of gate shield regions, wherein the plurality of gate structures are parallel to each other and separated from each other in a core area; and
   one or more termination structures surrounding the plurality of gate structures in a termination area, wherein the plurality of gate shield regions extend to a first termination structure in a predetermined pattern configured to balance charge in the core area and the termination area in a reverse bias condition, wherein the predetermined pattern includes one or more gate structures of a first set of the plurality of gate structures that surround ends of each respective one of a second set of the plurality of gate structures in the termination area, and wherein the first set of the plurality of gate structures are separated from adjacent ones of the second set of the plurality of gate structures and adjacent portions of the termination structure.

17. The MOSFET of claim 16, wherein:
the plurality of gate structure includes
   a plurality of gate regions disposed between a plurality of source regions and body regions;
   a plurality of gate shield regions disposed between the plurality of gate regions and a drift region;
   a plurality of gate shield insulator region disposed between the plurality of gate shield regions and the drift region; and
   a plurality of gate insulator region disposed between the plurality of gate regions and the plurality of gate shield regions, and between the plurality of gate regions and the source regions and body regions.

18. The MOSFET of claim 16, wherein:
the first termination structure includes;
   a first termination region surrounding a plurality of source regions, a plurality of body regions and the plurality of gate structures; and
   a first termination insulator region disposed about the first termination region.

19. The MOSFET of claim 16, wherein a spacing between the plurality of gate structure is approximately equal to a spacing between ends of the second set of the plurality of gate shield regions and the first termination structure.

20. The MOSFET of claim 16, wherein a spacing between the ends of the second set of the plurality of gate shield regions and the first termination structure is approximately one hundred and forty percent to sixty percent of a spacing between the plurality of gate structures.

21. The MOSFET of claim 16, wherein the width of the one or more termination structures is approximately between one hundred percent and one hundred and twenty percent of the gate structure.

22. The MOSFET of claim 16, wherein the depth of the one or more termination structures is approximately between one hundred percent and one hundred and twenty percent of the gate structure.

* * * * *